United States Patent
Meister et al.

(10) Patent No.: US 10,557,899 B2
(45) Date of Patent: Feb. 11, 2020

(54) ADJUSTMENT DEVICE FOR AN RF RESONANT CIRCUIT OF AN NMR PROBE HEAD

(71) Applicant: Bruker BioSpin AG, Faellanden (CH)

(72) Inventors: Roger Meister, Hinteregg (CH); Daniel Guy Baumann, Faellanden (CH); Daniel Schmidig, Schaffhausen (CH); Christian Kasper, Faellanden (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/026,552

(22) Filed: Jul. 3, 2018

(65) Prior Publication Data

US 2019/0011509 A1    Jan. 10, 2019

(30) Foreign Application Priority Data

Jul. 4, 2017   (DE) .......................... 10 2017 211 401

(51) Int. Cl.
   *G01R 33/36*      (2006.01)
   *H01G 4/38*       (2006.01)
   *G01R 33/34*      (2006.01)

(52) U.S. Cl.
   CPC ..... *G01R 33/3607* (2013.01); *G01R 33/3628* (2013.01); *H01G 4/38* (2013.01); *G01R 33/34092* (2013.01); *G01R 33/3635* (2013.01)

(58) Field of Classification Search
   CPC .......... G01R 33/34092; G01R 33/3607; G01R 33/3628; G01R 33/3635; H01G 4/38; H01G 5/38
   See application file for complete search history.

(56) References Cited

U.S. PATENT DOCUMENTS

| 1,350,279 A | 8/1920 | Howe |
| 1,594,700 A | 8/1926 | Trigg |

(Continued)

FOREIGN PATENT DOCUMENTS

| CN | 102735897 A | 10/2012 |
| DE | 19833350 C1 | 3/2000 |

(Continued)

OTHER PUBLICATIONS

Office Action in corresponding German Application 102017211401.0, dated Mar. 22, 2018, along with English Translation.

(Continued)

*Primary Examiner* — Rishi R Patel
(74) *Attorney, Agent, or Firm* — Edell, Shapiro & Finnan, LLC

(57) ABSTRACT

An adjustment device (1) for an RF resonant circuit (96) of an NMR probe (90) has a plurality of movable elements (6) which are arranged in succession, such that adjacent movable elements mutually engage, so as to be movable relative to one another in a limited range. The movable elements each have at least one electrical functional part (20; 20a-20b) for adjusting the RF resonant circuit. N outwardly oriented electrical contact elements (15; 15a-15b; 23, 24) include at least two functional part terminals (21, 22), and the electrical contact elements are each connected to a functional part terminal. The adjustment device also includes a first connection assembly (11) for slidingly contacting at least a portion of the movable elements from outside, to contact the contact elements in dependence on the movement position of the movable elements, as well as a movement device (4), configured to move one of the movable elements.

20 Claims, 11 Drawing Sheets

(56) References Cited

U.S. PATENT DOCUMENTS

| | | | |
|---|---|---|---|
| 5,986,455 | A | 11/1999 | Magnuson |
| 6,278,277 | B1 | 8/2001 | Zeiger |
| 7,701,219 | B2 | 4/2010 | Finnigan et al. |
| 9,267,970 | B2 | 2/2016 | Moreux et al. |
| 2007/0013378 | A1 | 1/2007 | Ikeda |
| 2009/0079424 | A1 | 3/2009 | Tralshawala et al. |
| 2009/0184710 | A1* | 7/2009 | Finnigan ............ G01R 33/3628 324/307 |
| 2017/0326015 | A1 | 11/2017 | Katzenstein |

FOREIGN PATENT DOCUMENTS

| | | |
|---|---|---|
| DE | 102006030640 A1 | 4/2007 |
| EP | 0930511 B1 | 7/1999 |
| EP | 1651973 A1 | 5/2006 |
| JP | H3223686 A | 10/1991 |
| JP | 200335759 A | 2/2003 |
| JP | 200747151 A | 2/2007 |
| JP | 2006-528349 A | 1/2008 |
| JP | 2008020397 A | 1/2008 |
| JP | 200820397 A | 8/2009 |
| WO | 2016128267 A1 | 8/2016 |

OTHER PUBLICATIONS

English Translation of Decision of Patent Grant in JPA 2018-12125E8, mailed Mar. 12, 2019.

* cited by examiner

ADJUSTMENT DEVICE FOR AN RF RESONANT CIRCUIT OF AN NMR PROBE HEAD

CROSS REFERENCE TO RELATED APPLICATIONS

This application claims foreign priority under 35 U.S.C. § 119(a)-(d) to German Application No. 10 2017 211 401.0 filed on Jul. 4, 2017, the entire contents of which are hereby incorporated into the present application by reference.

FIELD OF THE INVENTION

The invention relates to an adjustment device for an RF resonant circuit of an NMR probe.

BACKGROUND

An adjustable-frequency NMR probe is known from EP 0 930 511 B 1.

NMR (=nuclear magnetic resonance) spectroscopy is an efficient instrumental analysis method with which it is possible to study the chemical composition of measurement substances (samples). In the process, the measurement substance is exposed to a strong, static magnetic field, resulting in nuclear spin alignment in the measurement substance. After RF (=radio-frequency) pulses have been radiated in, RF signals emitted by the measurement substance are recorded and are evaluated in order to determine the chemical composition.

The strong, static magnetic field is often generated by superconducting magnets which are cooled in a cryostat. The sample to be studied is arranged in a room temperature bore of the cryostat. The RF pulses are radiated in and the RF signals are received by one or more RF resonator coils of a probe that projects into the room temperature bore. The probe typically also holds the sample to be measured.

The arrangement in the room temperature bore of the cryostat means that the installation space for the probe is extremely limited. In particular, the probe usually has to conform to an essentially cylindrical design.

The frequency of the RF pulses emitted by an RF resonator coil and the RF signals recorded thereby depends on the type of atomic nuclei studied and the strength of the static magnetic field. The RF resonator coil is part of an RF resonant circuit (electrical circuit), the resonant frequency of which results from the components contained (in particular the capacitance and inductance thereof) and the way said components are connected. The resonant frequency has to be matched to the type of atomic nuclei studied and the strength of the static magnetic field.

For NMR experiments involving different types of atomic nuclei and/or different magnetic field strengths, different probes may be made available, but this is very expensive and causes significant complexity when making the modifications.

EP 0 930 511 B1 relates to probes that can be set to different frequencies. However, the limited space restricts the number of components and the adjustment mechanisms thereof. An NMR probe is proposed comprising a capacitor having an adjustable capacitance, an inner capacitor element being movable relative to an outer capacitor element, using a screw connection, in order to allow for a compact structure. In this structure formed in the manner of a cylindrical capacitor, the capacitance can be adjusted steplessly, but only in a small capacitance range.

DE 198 33 350 C1 discloses a probe in which a measuring coil is connected to different input terminals in order to feed low-frequency isotopes (X) and the 1H core at a higher frequency. The 1H frequency is decoupled using a series capacitor and a lambda/4 line that has a capacitance per unit length that can be adjusted, over the length of the line, using a shorting plunger. The adjustment range is very small in this case too.

A lambda/4 line for an NMR probe that can be adjusted in a similar manner is also known from EP 1 651 973 B1.

In broadband probes by Bruker BioSpin AG, Fallanden, CH, a plurality of shift registers are installed in the probe. One capacitor can be selected by each shift register; the selected capacitors of the different shift registers are connected in parallel. The resonant frequency of an RF resonator coil can be adjusted by appropriately adjusting the shift register and/or selecting the capacitors. However, this design is expensive, in particular due to the actuators required for each shift register, and requires a lot of installation space, which limits the performance of the probe.

SUMMARY

One object addressed by the invention is that of providing an adjustment device for an RF resonant circuit of an NMR probe, which device allows a large adjustment range of resonant frequencies while nonetheless having a compact design and a simple actuation mechanism.

This object is addressed by an adjustment device for an RF resonant circuit of an NMR probe which is characterized:

in that the adjustment device comprises a plurality of movable elements which are arranged in succession, adjacent movable elements mutually engaging respectively into one another so as to be movable relative to one another in a limited range, in that the movable elements each comprise at least one electrical functional part for adjusting the RF resonant circuit, and N outwardly oriented electrical contact elements, where N is a natural number ≥1, each electrical functional part comprising at least two functional part terminals, and the electrical contact elements each being connected to a functional part terminal, in that the adjustment device further comprises a first connection assembly for slidingly contacting at least a portion of the movable elements from outside in order to contact the contact elements of the movable elements depending on the movement position of the movable elements, and in that the adjustment device further comprises a movement device, with which one movable element of the movable elements can be moved.

Within the context of the present invention, a plurality of movable elements can be used for adjusting an RF resonant circuit (electrical circuit). Each movable element comprises at least one electrical functional part that can be electrically contacted via the first connection assembly and thus incorporated into the RF resonant circuit, in particular in order to adjust a resonant frequency (or a resonant frequency interval) of the RF resonant circuit. Typical electrical functional parts are capacitors and coils or interconnections of said components. However, a functional part can also be formed as a shorting bridge for example.

The movable elements typically each comprise just one electrical functional part that can be incorporated (connected) into the RF resonant circuit or removed (disconnected) therefrom, depending on the movement position.

Alternatively, a movable element may also comprise a plurality of electrical functional parts, between which it is possible to switch, in the RF resonant circuit, depending on the movement position, it preferably also being possible to remove all the electrical functional parts of said movable element from the electrical circuit in at least one movement position of a movable element.

The RF resonant circuit and the associated probe can be adjusted to different atomic nuclei types (for example 1H, 13C, 15N and/or 109Ag) and different $B_0$ fields via the electrical functional parts that can be switched with the movable elements. In this case, it is possible to install electrical functional parts that are comparatively large and easy to insulate from one another, and which can also handle high powers (unlike in an integrated circuit for example).

The movement position of the movable elements can be adjusted by the movement device. The movement device preferably comprises an electric motor that is actuated automatically by an electronic controller. Since the movable elements mutually engage in succession and can move relative to one another only to a limited extent, rotating one of the movable elements can also cause the remaining movable elements to rotate into desired positions: If one movable element is rotated, an adjacent movable element is thus carried along therewith as soon as an edge (stop) of the limited mutual rotation range is reached.

Suitable angular displacements and reversals of the movement direction on the movement device make it possible to adjust virtually any movement positions of the individual movable elements. The movement device typically acts on just one movable element (usually the front element in the sequence).

Within the context of the invention, just one movement device is sufficient for adjusting a virtually unlimited number of movable elements, and thus adjusting the electrical properties of the RF resonant circuit (electrical circuit). The movable elements merely need to mutually engage in succession, and this is possible in a simple and compact manner in a linear sequence of the movable elements, in particular in an extension direction of an NMR probe or a room temperature bore of a cryostat that contains a superconducting magnet. The movement device may act on an outer end (remote from the sample to be studied by NMR), such that only a small amount of space is required in the probe and in particular it is not necessary to guide a plurality of actuating rods or the like along inside the probe.

In a preferred embodiment of the adjustment device according to the invention, the movable elements are formed as rotary elements that are rotatably mounted along a common axis and are arranged in succession along the common axis, and the movement device is also formed as a rotation device, by which one of the rotary elements can be rotated. The rotary elements that are axially adjacent in each case preferably mutually engage in the axial direction, so as to be rotatable relative to one another in a limited angle range $\alpha$. The first connection assembly is preferably designed for slidingly contacting the rotary elements from radially outside in order to contact the contact elements of the rotary elements, depending on the rotational position of the rotary elements.

This design is particularly simple and allows for a compact structure. The common axis can be formed for example by a central axial component or by a suitable external bearing, for example comprising bearing shells. The axis is typically oriented in the longitudinal direction of the probe or of a room temperature bore of a cryostat. The first connection assembly can extend in parallel with the axially lined up rotary elements. An electrical sliding contact can be easily installed from radially outside. The rotation device can be rotated using a motor, in a simple and cost-effective manner. It should be noted that for example linearly movable elements could alternatively also be provided.

In a preferred development of this embodiment, the limited angle range $\alpha$ is the same for at least a portion of the rotary elements, preferably for all of the rotary elements, $\alpha=360°/(2*N)$ being applicable for the limited angle range $\alpha$. Equal angle ranges (angular displacement ranges) are particularly simple to implement and easy to program within the context of automatic actuation of the rotary elements. The rotary elements are typically all identically formed. In a given case, for example the front (first) rotary element and/or the rear (last) rotary element may be designed differently from the other rotary elements, for example with respect to the number N of contact elements (contact surfaces); in this case, the limited angular displacement range $\alpha$ is likewise usually selected so as to be the same for all the rotary elements, i.e. $\alpha=360°/(2*N')$, where N': number of contact elements of the plurality of rotary elements. It should be noted that the rotatability of the rotary elements in each case need not be restricted relative to the (axial) bearing of said elements, and is generally not restricted either (optionally with the exception of a last rotary element, see below).

In a preferred development, $N \geq 2$ for at least a portion of the rotary elements, preferably for all the rotary elements, and the contact elements of a particular rotary element are arranged on the rotary element so as to be uniformly distributed in the peripheral direction. A simple structure is thus achieved, and the angular displacement (relative to N=1) is also reduced until the next time a contact element reaches the first connection assembly.

In an advantageous development, the adjustment device comprises a connection assembly for slidingly contacting at least a portion of the rotary elements from radially outside in order to contact the contact elements of the rotary elements, depending on the rotational position of the rotary elements and, for the rotary elements of said portion, in each case the number of contact elements N is $\geq 2$, and at least two functional part terminals of a functional part are connected to different contact elements. An electrical functional part can be fully electrically connected by the second connection assembly, said connection being particularly easily possible from radially outside. Moreover, it is easily possible to contact and uncontact, simultaneously, the two contact elements used for the electrical contact, allowing for particularly reliable switching behavior.

In a development thereof, for at least one rotary element of said portion of the rotary elements, just one electrical functional part is provided in the rotary element, N is an even number, the electrical contact elements of the at least one rotary element, which contact elements are in succession in the peripheral direction, are each connected alternately to a first functional part terminal and to a second functional part terminal of the electrical functional part of the rotary element thereof, and the first connection assembly and the second connection assembly are arranged such that, depending on the rotational position, for the at least one rotary element, either both connection assemblies are in contact with contact elements that are connected to different functional part terminals of the electrical functional part, or neither of the connection assemblies are in contact with an electrical contact element of the rotary element.

This allows for particularly reliable switching behavior and a small angle range between successive, electrically contacting switching positions if the polarity of the electrical functional part does not play a role (which is the case in particular in capacitors). Preferably, N=2, and therefore the contact elements in contact with different functional part terminals are mutually opposed. Accordingly, the first connection assembly and the second connection assembly are then also mutually opposed.

In another development, at least a portion of the rotary elements comprises a permanent contact element that is connected to a first functional part terminal of at least one electrical functional part of the rotary element, and the adjustment device comprises a permanent connection assembly that contacts the permanent contact elements of the rotary elements for said portion, irrespective of the rotational position of said contact elements. A permanent connection assembly is possible in particular for switching applications, in which the permanent connection assembly is to be implemented using different connection assemblies (contacted or not contacted, depending on the rotational position). The permanent connection assembly can for example extend through the rotary elements of said portion as a central axial rod. It is conceivable that said portion may comprise just one rotary element (in this case, usually the first or last rotary element).

In a further development of said development, for at least one rotary element of said portion of the rotary elements,
just one electrical functional part is provided in the rotary element,
and in each case all the contact elements of the rotary element are connected to an identical second functional part terminal of the electrical functional part. This simplifies the connection and disconnection of the permanent connection assembly at the first terminal of the electrical functional part via a corresponding rotational position of the (outer) contact elements on the first connection assembly. The angular displacements between the contacting rotational positions are particularly small.

In another development, for at least one rotary element of said portion of the rotary elements, one or more auxiliary connection assemblies are provided for slidingly contacting the rotary element from radially outside in order to contact a contact element of the rotary element depending on the rotational position of the rotary element, said contact element being connected to the second functional part terminal of an electrical functional part of the rotary element, and the first functional part terminal of said electrical functional part being connected to the permanent contact element of said rotary element,
in particular the electrical functional part of said rotary element being formed as a shorting bridge. The permanent connection assembly can be connected differently in a simple manner using the first connection assembly and the auxiliary connection assembly/assemblies, for example for switching between different basic functions or circuit parts of an NMR probe, for example for different types of atomic nuclei.

In another development, the adjustment device comprises a first rotary stop which limits the rotation, in a first direction of rotation, of an axially rearmost rotary element of the adjustment device. The rotation device can rotate the rotary elements in the first direction of rotation until the rearmost rotary element comes into contact with the rotary stop and the other rotary elements, which mutually engage adjacently in each case, also reach an end position ("basic position") as a result of the limited angle range. This results in a defined rotational position being assumed for all said rotary elements, proceeding from which position a desired rotational position of the rotary elements can easily be reached. There is then no need for advance information regarding the current rotational position of the rotary elements when the rotary elements are to assume a new rotational position. It should be noted that rotary stops are not required when the rotational positions of the rotary elements can be followed easily (for example in an automated manner).

According to a further development of said development, in a basic position of the rotary elements, in which all the rotary elements are rotated as far as possible in the first direction of rotation, the contact elements of the rotary elements are axially aligned, in particular the first connection assembly not being in contact with the electrical contact elements of the rotary elements in this basic position. The aligned arrangement in the basic position means that the adjustment device is particularly simple in terms of structure and in terms of the switchability of the rotary elements. In particular, the first connection assembly can be designed having a simple, straight structure.

According to a further development, the adjustment device comprises a second rotary stop which limits the rotation of the axially rearmost rotary element in a second direction of rotation that is counter to the first direction of rotation,
in particular the rotational positions of the rearmost rotary element differing, at the first rotary stop and at the second rotary stop, by an angle $\beta$, where ($\beta=\alpha$. A defined rotational position of the rotary elements can also be achieved by the second rotary stop, proceeding from which position a desired rotational position of the rotary elements can easily be reached. The first and the second rotary stop can for example be formed in a simple manner with a projection and a sector-shaped recess (or a sector-shaped space). When $\beta=\alpha$, an electrical functional part in the rearmost rotary element can be easily switched on and off (toggled) in a simple manner (when $\beta$ is minimal, in order to prevent unnecessary switching paths). In general, a difference between $\beta$ and ($\beta=\alpha*(2k-1)$, where k is a natural number$\geq 1$, can be established in order to create a different switching position of the last rotary element at the two stops.

Furthermore, a development is advantageous in which the rotary elements each form an essentially circular edge structure towards the radial outside, on which structure the rotary elements are mounted, in particular in a manner having one or more common bearing shells for all the rotary elements. The circular edge structure can be used to rotatably mount or guide the rotary elements, for example in the common bearing shell or shells, without the need for a central axial component. This allows for a particularly simple structure and assembly.

In another development, adjacent rotary elements on mutually facing main surfaces form at least one, preferably two, axial projections which engage in at least one, preferably two, axial depressions, in particular the axial projections and/or the axial depressions being essentially sector-shaped. This is a particularly simple option for mutual engagement, with which the angle range $\alpha$ can be limited.

In a preferred embodiment of an adjustment device according to the invention, the movement device acts on the frontmost movable element in the sequence of the movable elements. This makes it possible to actuate all the movable elements and to move the movable elements into mutually independent movement positions using the movement device. It should be noted that the adjustment is usually made starting with the rearmost movable element, and the further movable elements are then adjusted proceeding towards the front.

An embodiment is also preferred in which the adjustment device comprises a first stop that limits the movement, in a first movement direction, of the rearmost movable element of the adjustment device in the sequence of the movable elements. The movement device can move the movable elements in the first movement direction until the rearmost movable element comes into contact with the first stop and the other movable elements, which mutually engage adjacently in each case, also reach an end position ("basic position") as a result of the limited mutual movement range. This results in a defined movement position being assumed for all said movable elements, proceeding from which position a desired movement position of the movable elements can easily be reached. There is then no need for advance information regarding the current movement position of the movable elements when the movable elements are to assume a new movement position. It should be noted that stops are not required when the movement positions of the movable elements can be followed easily (for example in an automated manner).

According to a development of this embodiment, the adjustment device further comprises a second stop that limits the movement, in a second movement direction that is counter to the first movement direction, of the rearmost movable element of the adjustment device in the sequence of the movable elements. A defined movement position of the movable elements, proceeding from which position a desired movement position of the movable elements can easily be reached, can also be achieved with the second stop.

An embodiment is furthermore preferred in which the at least one portion of the movable elements is designed having electrical functional parts that have an identical electrical function but different magnitudes. This makes it possible to provide the electrical function in a wide magnitude range having fine subdivisions. For example, one portion of the movable elements can be formed having capacitors that each have a different capacitance (i.e. a different capacitance magnitude). It is also possible, however, to mix different electrical functions (such as capacitors and coils), or to provide a plurality of identical magnitudes (for example identical capacitances) for the same electrical function.

According to an advantageous development of this embodiment, different magnitudes are provided according to a binary series, each of the different magnitudes being established in an electrical functional part of a different movable element. The magnitudes double in each case in the binary series. The binary series makes it possible to adjust all the intermediate values of magnitudes in steps of the smallest magnitude established on one of the electrical functional parts.

An embodiment is furthermore advantageous in which the electrical functional parts of at least one portion of the movable elements, in particular all of the movable elements, are capacitors. Capacitors are compact, cheap, have little susceptibility to faults, and can be obtained over a large magnitude range, and therefore resonant frequencies of the RF resonant circuit can be adjusted in a wide range.

An embodiment is also preferred in which the first connection assembly and/or a second connection assembly electrically contacts at least a portion of the movable elements, in particular all of the movable elements, in parallel. As a result, the electrical functional parts of the movable elements can be connected and disconnected in a simple manner, in order to adjust the overall circuit. Any auxiliary connection assembly is generally connected in series with the first and second connection assembly.

An embodiment is furthermore preferred in which the first connection assembly and/or a second connection assembly forms a plurality of connection springs which each press against an outer face of a movable element, in particular the connection springs each pressing against a radial outer face of a rotary element and being axially aligned. The connection springs make it possible to establish very reliable electrical contact in a simple manner; through elastic deformation, the springs can create a (minimum) force that maintains the contact.

A development of this embodiment is particularly preferred in which one connection spring in each case comprises a plurality of connection fingers, in particular four or more connection fingers, which press against the outer face of a movable element and, when the movable element is in a suitable movement position, can simultaneously contact the same electrical contact element. The connection fingers can further improve the reliability of the electrical contact. The fingers can compensate for individual regions of unevenness on the movable elements.

According to another embodiment, the adjustment device comprises a latching mechanism with which the movable elements can be resiliently latched in different movement positions in each case,
in particular the movable elements being formed as rotary elements and in each case 2*N different latchable rotational positions being provided for each rotary element, which positions differ from one another by a rotation step angle γ, where γ=360°/(2*N). The latching makes the adjustment of desired movement positions of the individual movable elements particularly reliable. The 2*N rotational positions make it possible for an isolating intermediate position to be established in each case between two positions on contact elements, in order to disconnect the rotary element or an associated electrical functional part.

A development of an adjustment device comprising connection springs and a latching mechanism is also advantageous in which the latching mechanism is formed having depressions on the outer faces of the movable elements, in particular on the radial outer faces of rotary elements, in which depressions the connection springs engage. As a result, a latching mechanism can be created very easily, the connection springs carrying out a dual function (electrical contact and latching). Depressions are typically formed on the contact elements, and preferably also centrally between the contact elements (or, when there is just one contact element, opposite the contact element) on a radial outer face of the rotary elements.

In a preferred embodiment, the movable elements comprise a main body made of an electrically insulating material, in particular plastics material, the electrical functional parts of adjacent movable elements being separated from one another by a layer of the insulating material of at least one of the main bodies of the adjacent movable elements, in particular the movable elements being formed as rotary elements and, in the case of each rotary element, the main body completely surrounding the electrical functional component, and the N electrical contact elements protruding radially on the two axial sides. Reliable mutual electrical insulation of the electrical functional parts of adjacent movable elements can be achieved by way of this design.

The scope of the present invention also covers an NMR probe comprising an RF resonant circuit that comprises an RF resonator coil and an adjustment device according to the invention and described above. The adjustment device is compact and can adapt the NMR probe and/or the RF resonant circuit to different measuring tasks, for example different types of atomic nuclei or different magnetic field strengths. The NMR probe can be used in a versatile manner for capturing NMR spectra.

In a preferred embodiment of an NMR probe according to the invention, the probe further comprises a master switch, with which the adjustment device as a whole can be connected into the RF resonant circuit or separated from the RF resonant circuit, in particular the master switch making it possible for the adjustment device to be replaced in the RF resonant circuit by one or more alternative circuits. Disconnecting the adjustment device as a whole can minimize faults in the probe when the adjustment device is not required for a specific experiment, and optionally an alternative circuit is required instead.

Further advantages of the invention can be found in the description and the drawings. Likewise, the features mentioned above and set out in the following can each be used, according to the invention, individually per se or together in any combinations.

The embodiments shown and described are not exhaustive, but instead are of an exemplary nature for describing the invention.

BRIEF DESCRIPTION OF THE DRAWINGS

The invention is shown in the drawings and will be described in greater detail with reference to embodiments. In the drawings.

DETAILED DESCRIPTION

Figure 1:
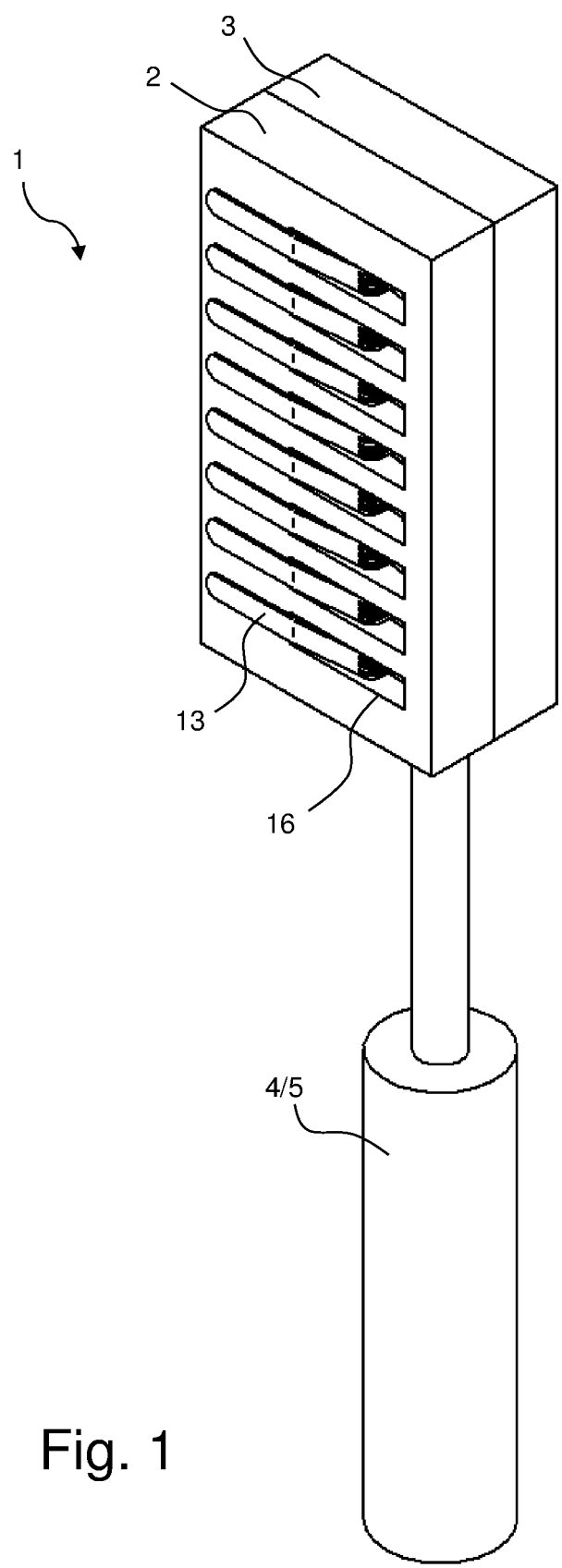
FIG. 1 is a schematic view of an embodiment of an adjustment device according to the invention.
Figure 2:
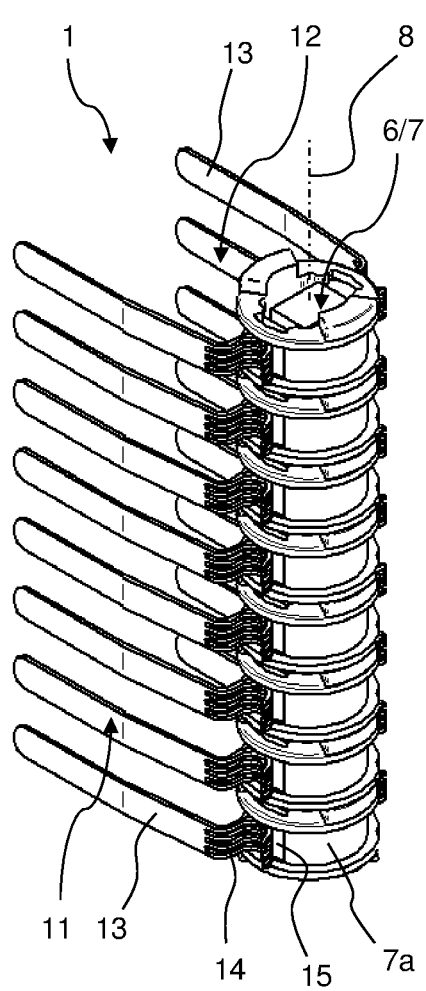
FIG. 2 is a schematic partial view of the adjustment device from FIG. 1, without bearing shells.
Figure 3:
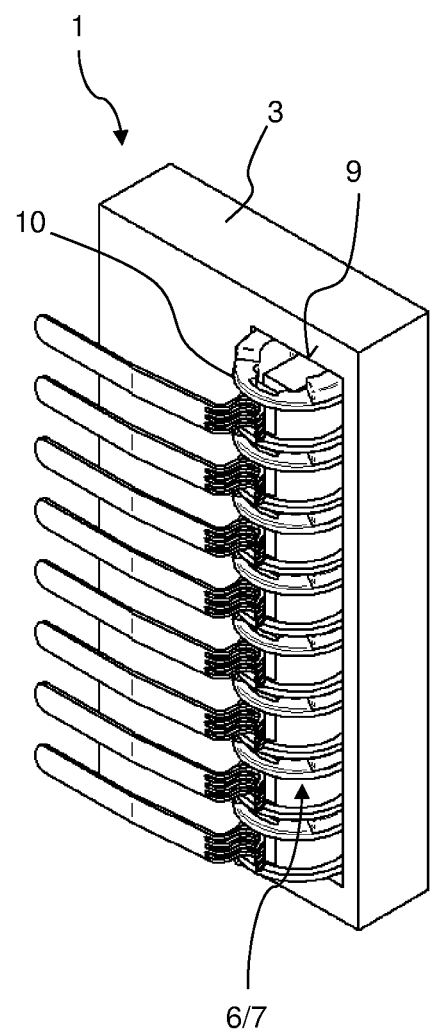
FIG. 3 is a schematic partial view of the adjustment device from FIG. 1, comprising a bearing shell.

FIG. 1 is a schematic oblique view of an embodiment of an adjustment device 1 according to the invention comprising two bearing shells 2, 3 and a movement device 4, in this case a rotation device 5. FIG. 2 is a partial view thereof, without the bearing shells 2, 3 and the movement device 4, and FIG. 3 is a further partial view having just one bearing shell 3 and without the movement device 4.

The adjustment device 1 comprises a sequence of movable elements 6, in this case rotary elements 7, which are arranged in succession along an axis 8, adjacent rotary elements 7 mechanically mutually engaging in each case (cf. also FIG. 4 and FIG. 5A below). The rotary elements 7 are individually rotatably mounted about the axis 8. For this purpose, depressions 9 are formed in the bearing shells 2, 3, which depressions are essentially the shape of a circular cylinder that has been halved along the cylinder axis thereof. Circular edge structures 10 of the rotary elements 7 can slide in said depressions 9 when the rotary elements 7 rotate about the axis 8.

A frontmost (bottommost in FIG. 2) rotary element 7a of the sequence of rotary elements 7 can be driven by the rotation device 5, and in particular can be rotated in a defined manner in each direction of rotation, in this case with an electric servomotor (not shown in greater detail).

The adjustment device 1 further comprises a first connection assembly 11, in this case formed having eight axially aligned connection springs 13, and a second connection assembly 12, in this case likewise formed having eight axially aligned connection springs 13. In this case, the connection springs 13 are each formed having four connection fingers 14 (see FIG. 7) which can contact the contact elements 15 of the movable elements 6 (see FIG. 4). Openings 16 are provided in the bearing shells 2, 3 in this case, in order to create space for the connection springs 13.

Figure 4:
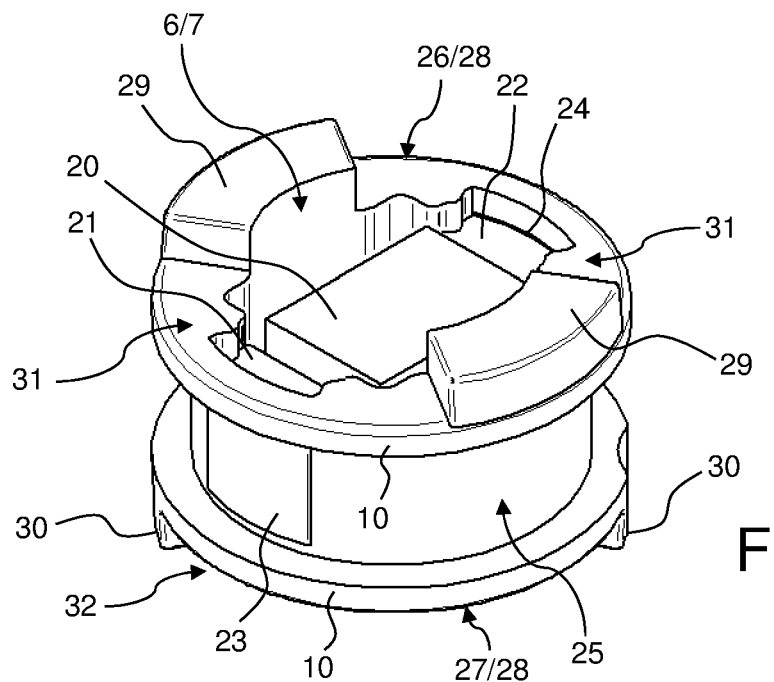
FIG. 4 is a schematic view of a movable element, in this case a rotary element, for the invention.

FIG. 4 shows, in greater detail, a movable element 6, in this case a rotary element 7, in the manner in which it can be installed in the adjustment device from FIG. 1.

In the embodiment shown, the rotary element 7 comprises an electrical functional part 20 having two functional part terminals 21, 22. In this case, the electrical functional part 20 is formed by a capacitor (covered by a housing of the functional part 20). The rotary element 7 further comprises two radially outwardly oriented electrical contact elements 23, 24. The functional part terminal 21 is electrically connected to the contact element 23, and the functional part terminal 22 is connected to the contact element 24 (largely covered in FIG. 4). The contact elements 23, 24 typically consist of copper or another highly electrically conductive metal.

The rotary element 7 comprises a main body 25 made of an electrically insulating material, in particular plastics material. The main body 25 surrounds the electrical functional part 20 on all sides, in particular also on a top 26 and bottom 27 of the rotary element 7. In this case, however, a cover is shown opened on the top 26 in FIG. 4, so that it is possible to see the functional part 20 (cf. FIG. 5A for the covered state). The main body 25 forms a circular edge structure 10 on the top 26 and bottom 27 in each case, which structure protrudes radially beyond the contact elements 23, 24. Overall, good dielectric strength can be achieved thereby.

Moreover, the main body 25 also forms two sector-shaped projections 29 on the top 26, which projections protrude axially beyond a top main surface 28. Two sector-shaped projections 30 are likewise formed on the bottom 27, which projections protrude axially beyond a bottom main surface 28. Depressions 31 remain between the projections 29, and depressions 32 (partially covered in FIG. 4) remain between the projections 30.

Figure 5A:
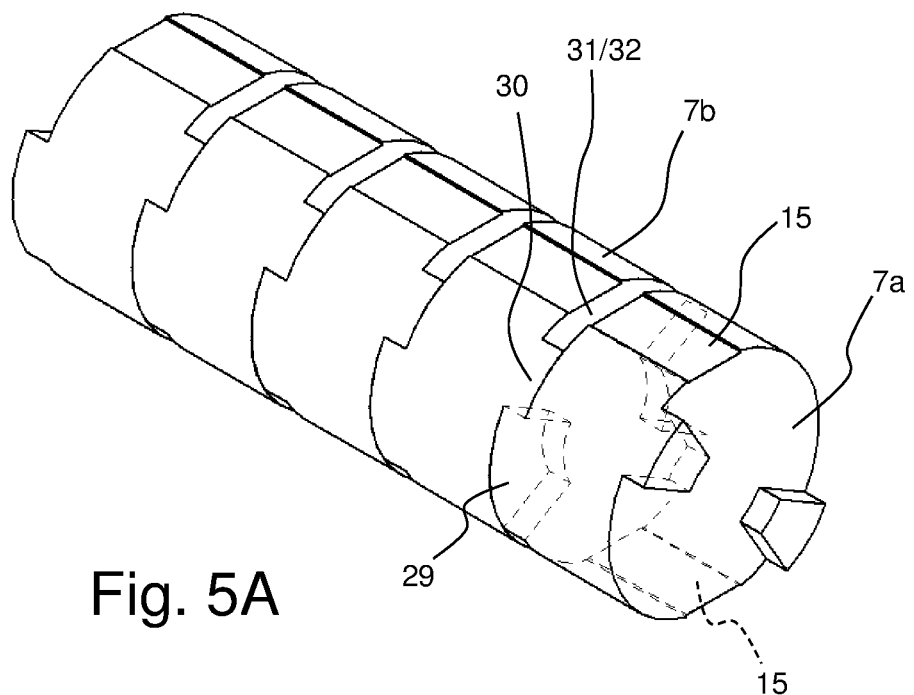
FIG. 5A is a schematic view of a mutually engaging sequence of, in this case five, rotary elements for the invention.
Figure 5B:
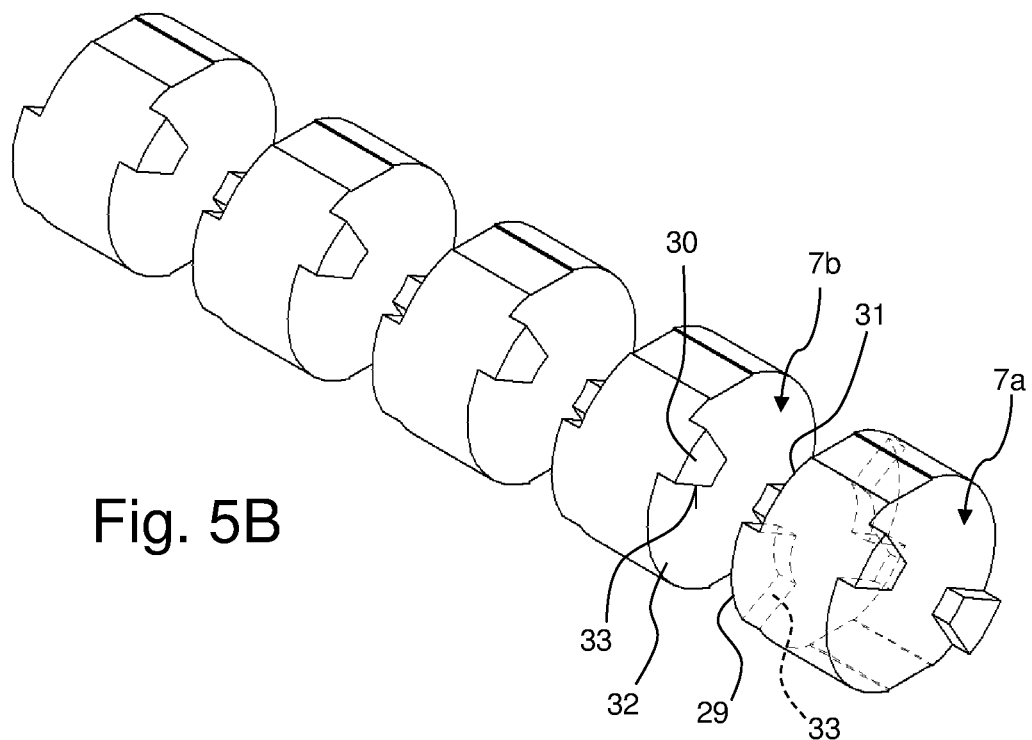
FIG. 5B is an exploded view of the sequence of rotary elements from FIG. 5A.

As shown in FIG. 5A and FIG. 5B, in the case of a sequence of rotary elements 7, the projections 29, 30 and depressions 31, 32 can achieve mutual engagement, as a result of which relative rotatability of adjacent rotary elements 7 is limited. This will be explained with reference to the rotary elements 7a and 7b.

The projections 29 of the frontmost (first) rotary element 7a engage in the depressions 32 of the second rotary element 7b. Vice versa, the projections 30 of the second rotary element 7b engage in the depressions 31 of the frontmost rotary element 7a. The lateral faces 33 of the projections 29, 30 of the rotary elements 7a, 7b, which faces extend in the radial direction, form mutually opposing stops which (when engaged, as shown in FIG. 5A) limit the mutual rotatability. In this case, the associated angle range (rotation range) corresponds to the angular interval of a depression minus the angular interval of the engaging projection.

In this case, the sizes (angular intervals) of the projections 29, 30 and of the depressions 31, 32 are dimensioned such that the rotary elements 7a, 7b are rotatable relative to one another by an angle range $\alpha$ of 90° (see in particular FIG. 6B), corresponding to 360°/(2*N), where N=2 (number of contact elements 15 of a rotary element 7a).

Figure 6A:
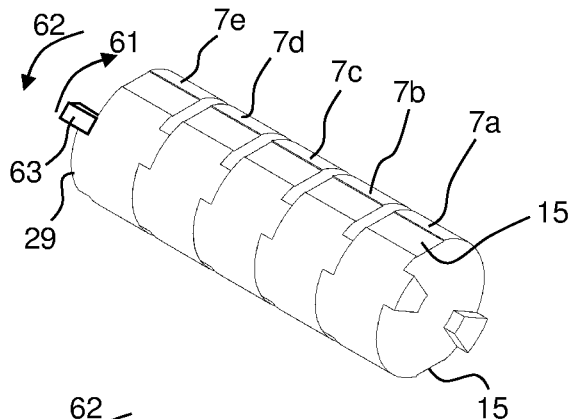
FIGS. 6A-6D show the sequence of rotary elements from FIG. 5A in different rotational positions of the rotary elements when actuated via the frontmost rotary element.
Figure 6B:
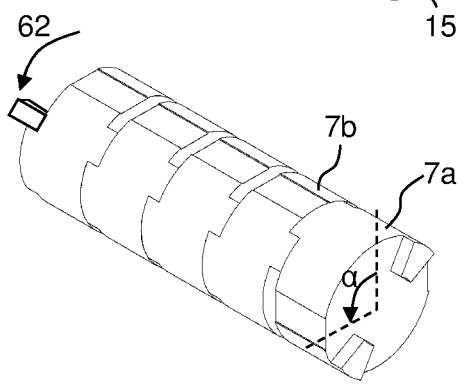

In the following, the way in which a desired rotational position is established in each case in different rotary elements 7a-7b in a sequence of mutually engaging rotary elements 7a-7e, as shown in FIG. 6A, will be explained. The rotational positions correspond to electrical switching positions.

In this case, the frontmost rotary element 7a can be rotated by a rotation device (not shown, but cf. FIG. 1). In this case, the rotary elements 7a-7e each comprise two mutually opposing contact elements 15 (partially covered) and can be rotated relative to one another by $\alpha$=90°. The polarity of the contact elements 15 is irrelevant (this applies in particular in the case of capacitors as the electrical functional parts), and therefore it is sufficient to distinguish between rotational positions in which the contact elements 15 are vertical and in which the contact elements 15 are horizontal.

In the simplest case, the sequence is first moved into a defined initial position, as shown in FIG. 6A. In this case, the frontmost rotary element 7a has been rotated as far as possible in a first direction of rotation 61, until a rearmost (last) rotary element 7e is fixed by a first rotary stop 63 which interacts in this case with the projection 29 of the rotary element 7e. In this initial position, all the contact elements 15 of the rotary elements 7a-7e are aligned in the case of vertical contact elements 15.

A check is then made as to whether or not the rearmost rotary element 7e is in the desired rotational position thereof. If this is not the case, the frontmost rotary element 7a is rotated counter to the direction of rotation last used (i.e. in a second direction of rotation 62), until the rearmost rotary element 7e is moved into the desired rotational position. If the rearmost rotary element 7e is already in the desired rotational position, it is possible to continue adjusting the rotation of the penultimate rotary element 7d. If the rotational position thereof needs to be changed, the frontmost rotary element 7a is again rotated counter to the direction of rotation last used, until the desired rotational position is achieved. The process is then continued for the next frontmost adjacent rotary element 7c, and so on.

In the present example, in FIG. 6A the rotary elements 7e, 7d and 7c are already in the desired rotational positions (vertical). However, the rotary elements 7b, 7a need to be moved into the other rotational position (horizontal).

Accordingly, the frontmost rotary element 7a is first rotated in the second direction of rotation 62. In a first adjustment step (cf. FIG. 6B), the rotary element 6a is first rotated about the angle range $\alpha$ of 90°, by which range the first rotary element 7a has "clearance" with respect to the second rotary element 7b.

Figure 6C:
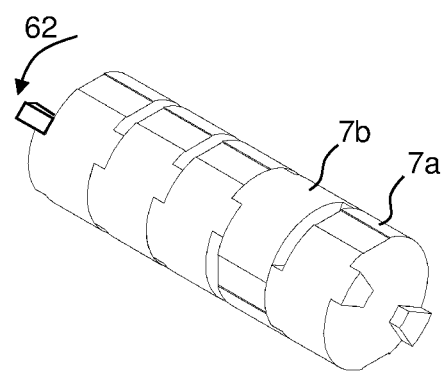

When rotated by a further adjustment step in the second direction of rotation 62, the first rotary element 7a carries along the second rotary element 7b therewith, cf. FIG. 6C. As a result, the second rotary element 7b has reached the desired rotational position (horizontal). However, the first rotary element 7a is incorrectly positioned.

Figure 6D:
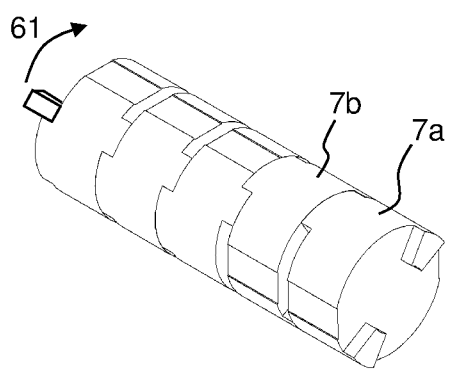

Therefore, only the frontmost rotary element 7a is rotated one step back in the first direction of rotation 61, cf. FIG. 6D. In the process, depending on the "clearance" thereof, the first rotary element 7a does not carry along the second rotary element 7b therewith. All the rotary elements 7a-7e have then reached the desired rotational position thereof.

Figure 7:
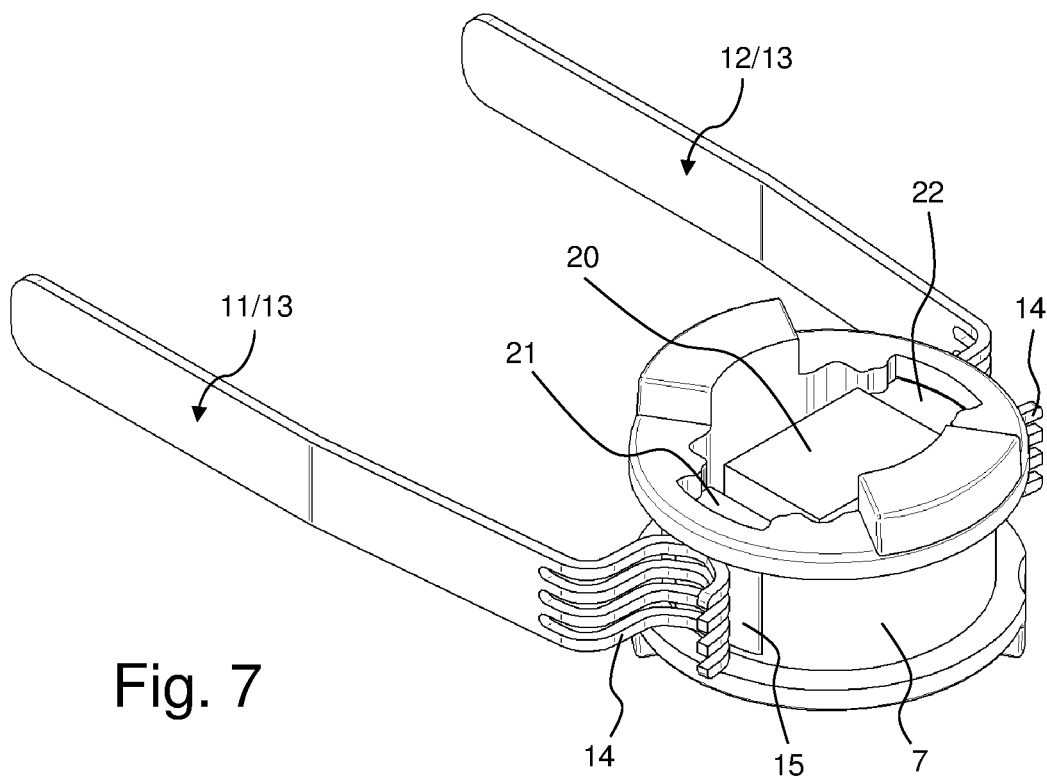
FIG. 7 is a schematic view of a rotary element, in the event of contact by connection springs of a first at second connection assembly, for the invention.

The rotational position of a rotary element 7 determines if, and optionally which, contact elements 15 of the rotary element 7 are electrically contacted by a first and optionally second connection assembly 11, 12; cf. FIG. 7.

In the embodiment shown, each connection spring 13 is in contact with the rotary element 7 from radially outside; in this case, the connection spring 13 presses slightly on the rotary element 7 through resilient pre-tensioning. When the rotary element 7 is in a corresponding rotational position (shown in FIG. 7), the connection spring 13 touches a contact element 15, with the result that electrical contact with a terminal 21, 22 of an electrical functional part 20 is established. For particularly reliable electrical contact, the connection spring 13 comprises four connection fingers 14 in this case, which fingers simultaneously touch the contact element 15. In this case, the connection spring 13 and the connection fingers 14 are rounded, also in order to improve the electrical contact.

Rotating the rotary element 7 can stop the contact with the contact element 15, i.e. the electrical functional part 20 can be electrical isolated. This will be explained in greater detail in the following.

Figure 8:
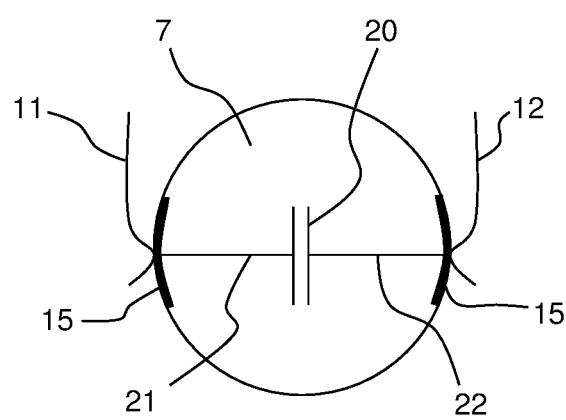
FIG. 8 is a functional diagram of a rotary element for the invention, comprising two contact elements and a capacitor as the electrical functional part.

FIG. 8 is a schematic cross section of a simple rotary element 7 for the invention. The rotary element 7 is provided with an electrical functional part 20, in this case a capacitor, the functional part terminals 21, 22 of which are connected to two mutually opposing contact elements 15. In the rotational position shown, the electrical functional part 20 is active, since the connection assemblies 11, 12 are touching the contact elements 15.

In contrast, rotation by 90° (not shown) would electrically isolate or disconnect the electrical functional part 20.

Figure 9A:
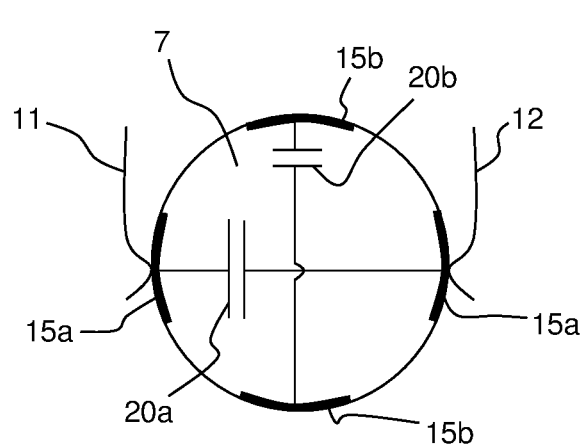
FIG. 9A is a functional diagram of a rotary element for the invention, comprising four contact elements and two capacitors as electrical functional parts, for rotation steps of 90°.

In contrast, the rotary element of FIG. 9A is provided with two electrical functional parts 20a, 20b, in this case capacitors of different capacitances. The electrical functional part 20a is connected to the mutually opposing contact elements 15a. In contrast, the electrical functional part 20b is connected to the mutually opposing contact elements 15b. In the rotational position shown, the electrical functional part 20a is active, since the connection assemblies 11, 12 are touching the contact elements 15a. Rotating the rotary element 7 by 90° (not shown) would instead make the electrical functional part 20b active, since the connection assemblies 11, 12 would then touch the contact elements 15b.

Figure 9B:
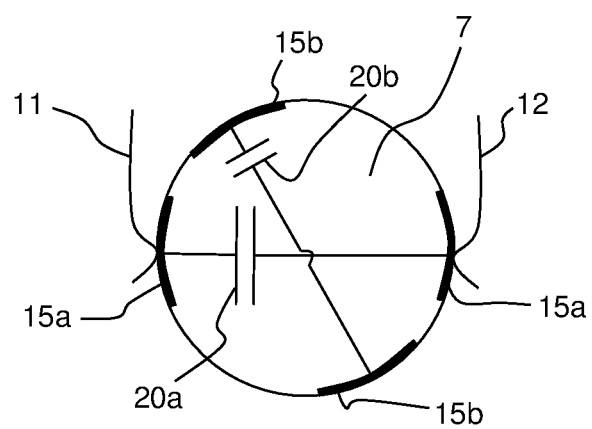
FIG. 9B is a functional diagram of a rotary element for the invention, comprising four contact elements and two capacitors as electrical functional parts, for rotation steps of 60°.

The rotary element 7 of FIG. 9B is likewise formed having two electrical functional parts 20a, 20b, which can each be electrically contacted by mutually opposing contact elements 15a, 15b. In this case, it is possible to switch between the two electrical functional parts 20a, 20b and an isolated (electrically disconnected) rotational position via rotary steps of 60° in each case.

The rotary element 7 shown in FIG. 10A essentially corresponds to the rotary element of FIG. 8, and therefore only the essential differences will be explained here.

In this case, a latching mechanism 70 is formed on the rotary element 7. Said latching mechanism uses the spring force of the connection springs 13 of the connection assemblies 11, 12. The connection springs 13 engage in depressions 71 that are formed by the contact elements 15, on the radial outer face 72 of the rotary element 7. A force (counter to the spring force of the connection springs 13) therefore has to be applied in order to leave the rotational position shown in FIG. 10. As a result, this rotational position, having an active electrical functional part 20, is "latched".

Depressions 73 are furthermore formed on the outer face 72 of the rotary element 7, which depressions are offset in this case by γ=90° relative to the depressions 71. The angle γ is also referred to as the rotation step angle, cf. FIG. 10B. Following a rotation by said rotation step angle γ, the connection springs 13 engage in said depressions 73, as a result of which this rotational position, having an inactive electrical functional part 20, is also "latched". In this rotational position, the connection springs 13 engage in the electrically isolated depressions 73 located between the depressions 71 of the contact elements 15 ("intermediate position").

In this case, the rotation capacity of the rotary element 7 is again limited by a (fixed) first rotary stop 63 and a (fixed) second rotary stop 64. Said fixed rotary stops 63, 64 are typically used for a last rotary element in a sequence. In this case, the rotary stops 63, 64 interact with an axially protruding stop pin 65 of the rotary element 7. The rotary element 7 can be rotated between the rotary stops 63, 64 by an angle γ, which is likewise 90° in this case.

Figure 10A:
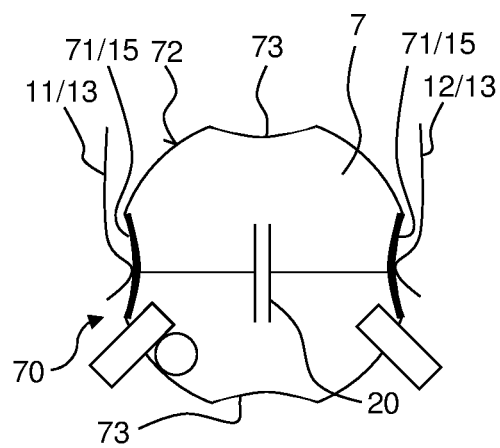
FIG. 10A is a functional diagram of a rotary element for the invention, comprising depressions two contact elements and for two intermediate positions, and comprising a first and second rotary stop.
Figure 10B:
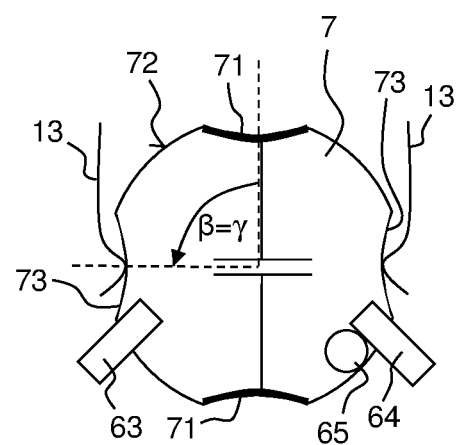
FIG. 10B shows the rotary element from FIG. 10A in a rotational position rotated by 90°.
Figure 11:
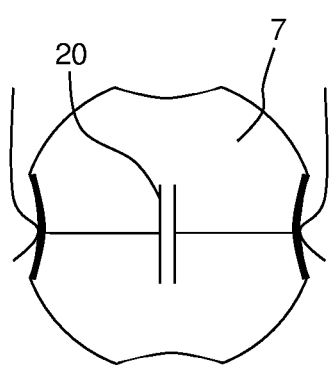
FIG. 11 shows the rotary element from FIG. 10A, but without rotary stops.

FIG. 11 shows a rotary element 7 that corresponds to FIG. 10A, but without any rotary stops being provided. The rotary element 7 can be used for example as the frontmost rotary element or as one of the middle rotary elements of a sequence of rotary elements. In this case, rotations by an adjustment step angle γ of 90° in each case allows for four different latched rotational positions (latching positions) of the rotary element 7, each rotary element 7 being able to be adjusted as far as desired in each direction of rotation (provided that other engaging rotary elements do not have a limiting effect). Following each adjustment step of γ=90°, the function (electrical functional part 20 active or inactive) is swapped, and following two adjustment steps of 180° in total, the same function is achieved again.

Figure 12:
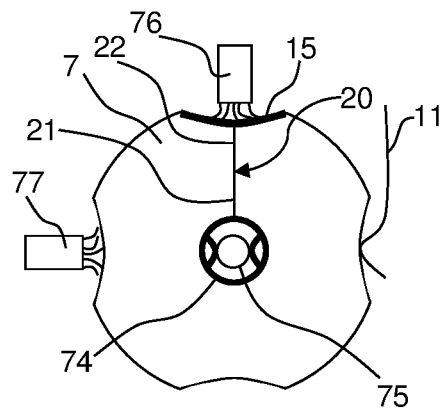
FIG. 12 is a functional diagram of a rotary element for the invention, comprising a contact element and a permanent contact element.

The rotary element 7 shown in FIG. 12 comprises a permanent contact element 74 which constantly (irrespective of the rotational position of the rotary element 7) touches a permanent connection assembly 75 and thereby establishes electrical contact. In this case, the permanent connection assembly 75 is formed by an axially extending metal rod. In this case, the permanent contact element 74 is formed having two contact springs which press lightly on the metal rod located therebetween.

In this case, the rotary element 7 comprises one single, radially outwardly oriented, electrical contact element 15. In this case, a shorting bridge is provided as the electrical functional part 20, the first functional part terminal 21 of which bridge is connected to the permanent contact element 74, and the second functional part terminal 22 of which bridge is connected to the contact element 15.

Depending on the rotational position of the rotary element 7, the contact element 15 can contact the first connection assembly 11, a first auxiliary connection assembly 76 (as shown in FIG. 12), a second auxiliary connection assembly 77, or "nothing"; in this case, the rotational positions differ by a rotation angle of 90° in each case.

Figure 13:
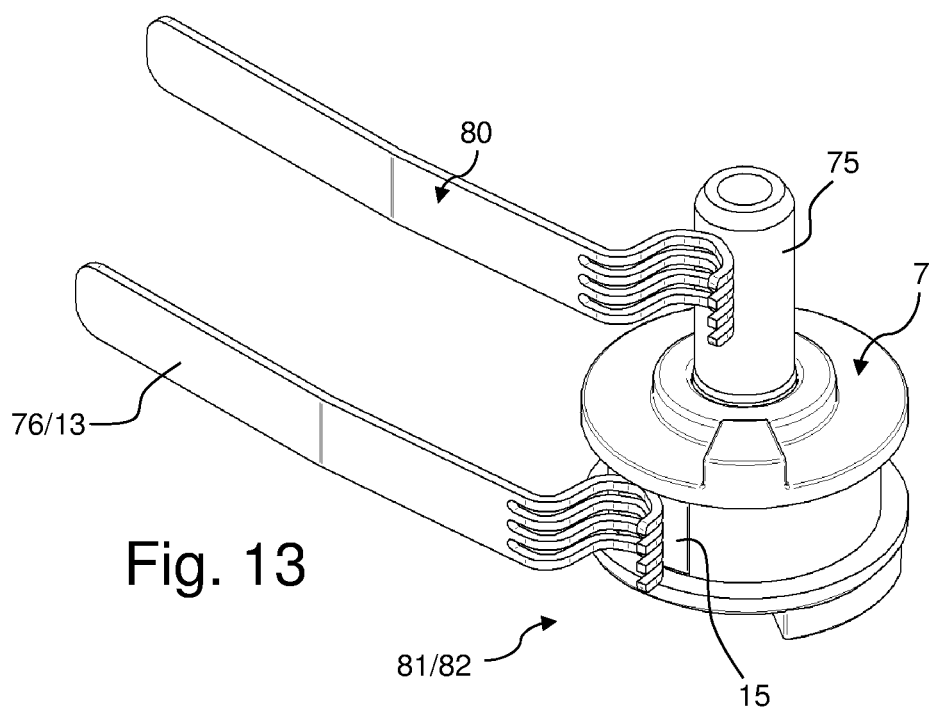
FIG. 13 is a schematic view of a further rotary element, comprising a permanent contact element, for the invention.

FIG. 13 shows a rotary element 7 for an adjustment device according to the invention, in which a permanent connection assembly 75 is formed as an axial metal rod that protrudes into the rotary element 7 and is electrically connected to a first functional part terminal of the electrical functional part (covered in FIG. 13) of the rotary element 7, irrespective of the rotational position of the rotary element 7. In the embodiment shown, a connection spring 80 is in contact with the permanent connection assembly 75 and brings about a further electrical connection. The rotary element 7 further comprises a radially outwardly oriented contact element 15 that can be contacted by a connection spring 13 of an auxiliary connection assembly 76, depending on the rotational position. The contact element 15 is electrically connected to a second functional part terminal of the electrical functional part (again covered in FIG. 13).

The rotary element 7 shown is typically used as an on/off switch 81 (the electrical functional part then generally being a shorting bridge or a low-ohmic resistor), for example in order to switch on and off all further rotary elements (not shown) that are connected in series and comprise electrical functional parts of the adjustment device. In the latter case, the rotary element 7 is used as the "master switch" 82. The rotary element 7 shown is then usually a frontmost or last rotary element in the sequence of mutually engaging rotary elements.

Figure 14:
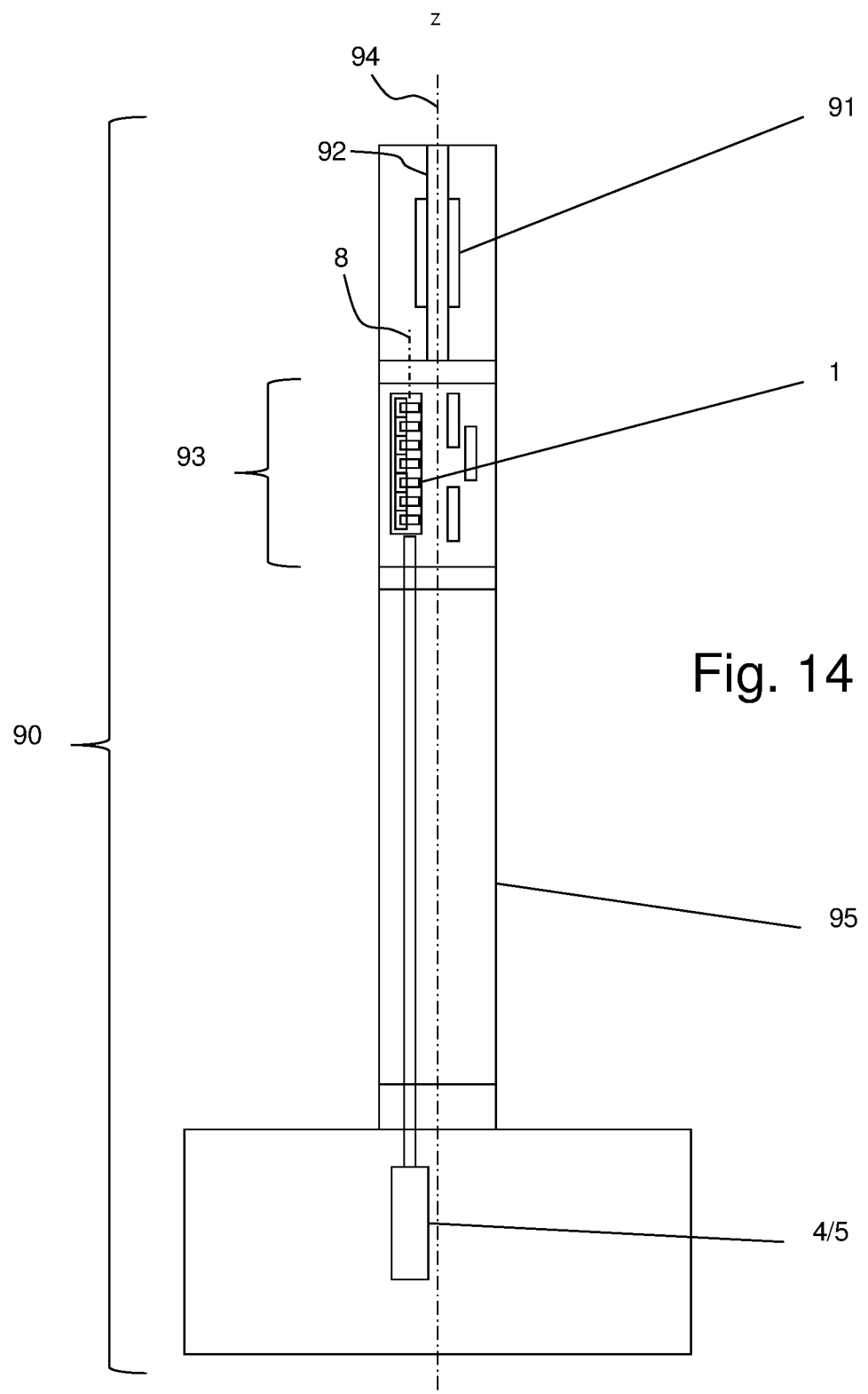
FIG. 14 is a schematic view of an NMR probe according to the invention, comprising an adjustment device according to the invention.

FIG. 14 schematically shows an embodiment of an NMR probe 90 according to the invention. The NMR probe 90 comprises a set of RF resonator coils (RF coils) 91. The RF resonator coils 91 emit RF pulses to a sample and/or receive RF signals from a sample, the sample being arranged inside the RF resonator coils. For this purpose, for example a sample tube (not shown) can be inserted into a recess 92. The inserted sample tube then passes through the space enclosed by the RF resonator coils 91. The RF resonator coils 91 and the recess 92 are oriented along a z-axis 94 which, when the NMR probe 90 is in use, corresponds to the direction of a static magnetic field $B_0$.

The RF resonator coils 91 are connected to an RF network 93 in a manner that is not shown in greater detail. The RF network 93 comprises an adjustment device 1 according to the invention, as shown in FIG. 1 for example. The adjustment device 1 can be actuated by the movement device 4, in this case a rotation device 5. The RF network 93 is surrounded by a shielding tube 95. In the adjustment device 1, rotary elements are lined up along an axis 8 that extends in parallel with the z-axis 94.

The NMR probe 90 has an essentially cylindrical structure and, when in use, is typically introduced into the room temperature bore of a cryostat that contains a superconducting magnet coil system (not shown in greater detail).

Figure 15:
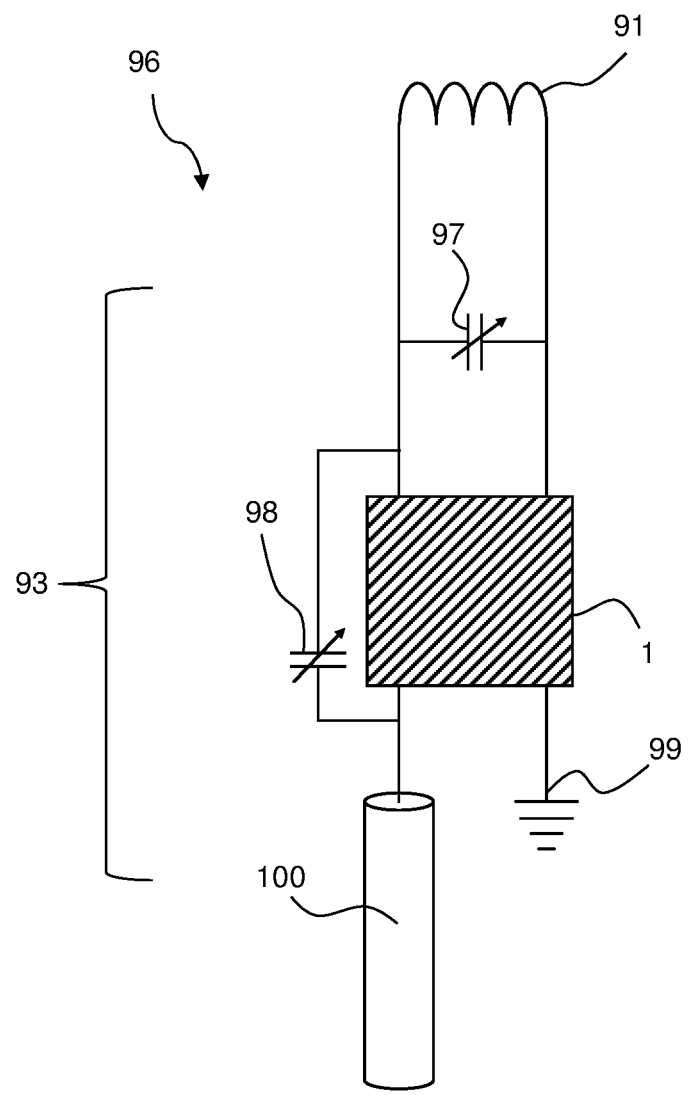
FIG. 15 is a schematic view of an RF resonant circuit comprising an adjustment device according to the invention.

FIG. 15 shows an RF resonant circuit (resonator circuit) 96 by way of example, which circuit can be adjusted within the context of the invention. The RF resonant circuit 96 comprises at least one RF resonator coil 91 that is connected to an RF network 93. In this case, the RF network 93 comprises a variable tuning capacitor 97, a variable matching capacitor 98 and an adjustment device 1 according to the invention, with which in this case a capacitance between the left-hand and right-hand connections thereof can be adjusted (see also FIG. 16). The adjustment device 1 as a whole can preferably be connected and disconnected by with a master switch (not shown in greater detail). In addition, the RF network 93 comprises a connection to ground 99 and a connection for a coaxial cable 100 that comprises to a pre-amplifier (for receiving signals) or to a transmitter (for emitting pulses) (not shown in greater detail).

The RF resonator coil 91 and the RF network 93 form a tuned circuit, the resonant frequency of which can be matched, in particular with the adjustment device 1, to the measuring task to be carried out.

Figure 16:
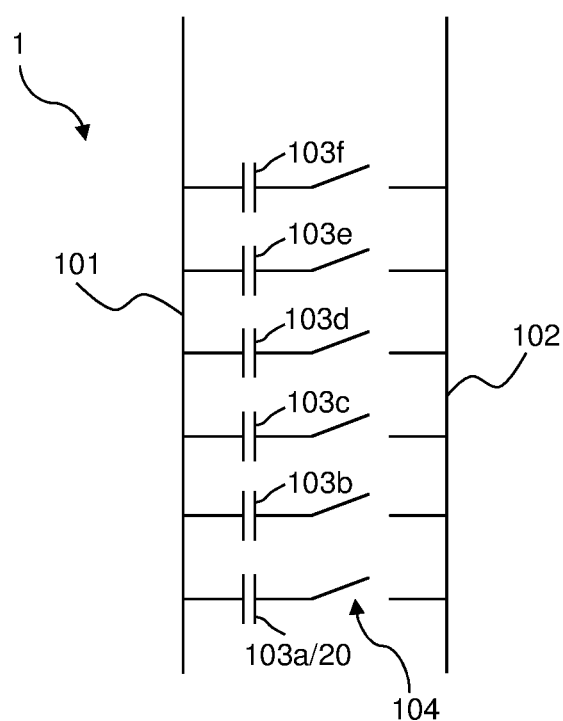
FIG. 16 is an equivalent circuit diagram of an embodiment of an adjustment device according to the invention for the RF resonant circuit from FIG. 15.

FIG. 16 shows, on the basis of an example, an equivalent circuit diagram of the adjustment device 1 illustrating how said device can be used in the RF resonant circuit 96 from FIG. 15. The adjustment device 1 comprises a first busbar (a first bus) 101 and a second busbar (a second bus) 102, between which different electrical functional parts 20, in this case capacitors 103a-103f, can be connected to or disconnected from one another in parallel.

The first busbar 101 can be formed as a first connection assembly for example, and the second busbar 102 as a second connection assembly. The relevant switches 104 are formed by movable elements, for example rotary elements. In this case, different switch positions correspond to different movement positions or rotational positions. The electrical functional parts 20 are installed in the movable elements.

In the embodiment shown, the capacitances (or capacitance magnitudes) of the capacitors 103a-103f are established in accordance with a binary series, in this case, by way of example:

| Capacitor | Capacitance magnitudes |
|---|---|
| 103a | 1 pF |
| 103b | 2 pF |
| 103c | 4 pF |
| 103d | 8 pF |
| 103e | 16 pF |
| 103f | 32 pF |

A total capacitance between the busbars 101, 102 of between 1 pF and 63 pF can be adjusted, in steps of 1 pF, using the capacitors 103a-103f. In addition, the two busbars 101, 102 can be electrically isolated from one another when all the switches 104 are opened. This corresponds, overall to $2^n$, where n is the number of movable elements/switches, in this case six, i.e. in total 64 different combinations of switching states. Said states can be reached using just one movement device.

LIST OF REFERENCE SIGNS 1 adjustment device
2, 3 bearing shells
4 movement device
5 rotation device
6 movable element
7 rotary element
7a front (first) rotary element
7b second-from-front (second) rotary element
7c rotary element
7d penultimate rotary element
7e last rotary element
8 axis
9 recess (in bearing shell)
10 circular edge structure
11 first connection assembly
12 second connection assembly
13 connection spring
14 connection finger
15, 15-15b electrical contact elements
16 opening
20, 20a-20b electrical functional parts
21 first functional part terminal
22 second functional part terminal
23, 24 electrical contact elements
25 main body
26 top
27 bottom
28 main surface
29, 30 projections
31, 32 depressions
33 lateral faces
61 first direction of rotation
62 second direction of rotation
63 first rotary stop
64 second rotary stop
65 stop pin
70 latching mechanism
71 depression (on the contact element)
72 outer face
73 depression (at intermediate position)
74 permanent contact element
75 permanent connection assembly
76 first auxiliary connection assembly
77 second auxiliary connection assembly
80 connection spring (on permanent connection assembly)
81 on/off switch
82 master switch
90 NMR probe
91 RF resonator coil
92 recess
93 RF network
94 z-axis
95 shielding tube
96 RF resonant circuit
97 tuning capacitor
98 matching capacitor
99 connection to ground
100 coaxial cable
101 first busbar
102 second busbar
103a-103f capacitors 104 switch
α limited angle range
β angle (between rotary stops)
γ adjustment step angle (between latching positions)

What is claimed is:

1. Adjustment device for a radio frequency (RF) resonant circuit of a nuclear magnetic resonance (NMR) probe comprising:
 a plurality of movable elements arranged in succession, wherein adjacent ones of the movable elements respectively mutually engage into one another so as to be movable relative to one another in a limited range,
  wherein the movable elements each comprise at least one electrical functional part for adjusting the RF resonant circuit and N outwardly oriented electrical contact elements, where N is a natural number ≥1, and
  wherein each electrical functional part comprises at least two functional part terminals, and the electrical contact elements are each connected to one of the functional part terminals,
 a first connection assembly configured to slidingly contact at least a portion of the movable elements from outside in order to connect the electrical contact elements of the movable elements depending on movement positions of the movable elements, and
 a movement device configured to move at least one movable element of the movable elements.

2. Adjustment device according to claim 1, wherein the movable elements are formed as rotary elements that are rotatably mounted along a common axis and are arranged in succession along the common axis, and wherein the movement device is formed as a rotation device configured to rotate one of the rotary elements.

3. Adjustment device according to claim 2, wherein the rotary elements that are respectively axially adjacent mutually engage in the axial direction, so as to be rotatable relative to one another in a limited angle range α, and wherein the first connection assembly is configured to slidingly contact the rotary elements from radially outside in order to connect the electrical contact elements of the rotary elements, depending on rotational positions of the rotary elements.

4. Adjustment device according to claim 3, wherein the limited angle range α is the same for at least a portion of the rotary elements, and wherein α=360°/(2*N) for the limited angle range α.

5. Adjustment device according to claim 2, further comprising a second connection assembly configured to slidingly connect at least a portion of the rotary elements from radially outside in order to connect the electrical contact elements of the rotary elements depending on rotational positions of the rotary elements, and wherein, respectively for the rotary elements of said portion,
 the number of electrical contact elements is N≥2, and at least two functional part terminals of a functional part are connected to different electrical contact elements.

6. Adjustment device according to claim 2, wherein:
 at least a portion of the rotary elements comprises a permanent contact element that is connected to a first functional part terminal of at least one electrical functional part of the rotary element,
 and wherein the adjustment device comprises a permanent connection assembly that contacts the permanent contact elements of the rotary elements of said portion, irrespective of the rotational position of the electrical contact elements.

7. Adjustment device according to claim 1, wherein the movement device acts on a frontmost one of the movable elements in the sequence of the movable elements.

8. Adjustment device according to claim 1, further comprising a first stop that limits the movement, in a first movement direction, of a rearmost one of the movable elements in the sequence of the movable elements.

9. Adjustment device according to claim 8, further comprising a second stop that limits the movement, in a second movement direction that is counter to the first movement direction, of the rearmost movable element in the sequence of the movable elements.

10. Adjustment device according to claim 1, wherein at least one portion of the movable elements is configured with electrical functional parts that have a mutually identical electrical function but respectively differing magnitudes.

11. Adjustment device according to claim 10, wherein the differing magnitudes are provided according to a binary series, each of the differing magnitudes being established in an electrical functional part of a different movable element.

12. Adjustment device according to claim 1, wherein the electrical functional parts of at least one portion of the movable elements are capacitors.

13. Adjustment device according to claim 1, wherein the first connection assembly and/or a second connection assembly electrically connects at least one portion of the movable elements in parallel.

14. Adjustment device according to claim 1, wherein the first connection assembly and/or a second connection assembly forms a plurality of connection springs that each press against a respective outer face of a respective one of the movable elements.

15. Adjustment device according to claim 1, further comprising a latching mechanism configured to resiliently latch the movable elements in respectively differing movement positions.

16. Adjustment device according to claim 15, wherein the movable elements are formed as rotary elements and 2*N respectively differing latchable rotational positions are provided for each rotary element, which positions differ from one another by a rotation step angle γ, where γ=360°/(2*N).

17. Adjustment device according to claim 1, wherein the movable elements each comprise a respective main body made of an electrically insulating material, wherein the electrical functional parts of adjacent ones of the movable elements are separated from one another by a layer of the insulating material of at least one of the main bodies of the adjacent movable elements.

18. Adjustment device according to claim 17, wherein the movable elements are formed as rotary elements and the respective main bodies completely surround the electrical functional components of each of the rotary elements, and the N electrical contact elements protrude radially on the two axial sides.

19. NMR probe comprising an RF resonant circuit having an RF resonator coil and an adjustment device according to claim 1.

20. NMR probe according to claim 19, further comprising a master switch that connects or disconnects the adjustment device into or from the RF resonant circuit.

* * * * *